(12) United States Patent
Yamamoto et al.

(10) Patent No.: US 11,958,416 B2
(45) Date of Patent: Apr. 16, 2024

(54) DISPLAY PANEL

(71) Applicants: DaikyoNishikawa Corporation, Hiroshima (JP); HOSIDEN CORPORATION, Osaka (JP)

(72) Inventors: Shigeki Yamamoto, Higashihiroshima (JP); Hideki Yamashita, Higashihiroshima (JP); Yoshihisa Mantoku, Higashihiroshima (JP); Masato Shimizu, Yao (JP); Takeshi Isoda, Yao (JP)

(73) Assignees: DaikyoNishikawa Corporation, Hiroshima (JP); HOSIDEN CORPORATION, Osaka (JP)

( * ) Notice: Subject to any disclaimer, the term of this patent is extended or adjusted under 35 U.S.C. 154(b) by 188 days.

(21) Appl. No.: 17/553,004

(22) Filed: Dec. 16, 2021

(65) Prior Publication Data

US 2022/0105877 A1    Apr. 7, 2022

Related U.S. Application Data

(63) Continuation of application No. PCT/JP2020/019522, filed on May 15, 2020.

(30) Foreign Application Priority Data

Jun. 27, 2019    (JP) ................................. 2019-119896

(51) Int. Cl.
*B60R 11/02*    (2006.01)
*B60R 16/02*    (2006.01)
(Continued)

(52) U.S. Cl.
CPC .......... *B60R 11/0235* (2013.01); *B60R 16/02* (2013.01); *G09F 13/00* (2013.01); *H01H 36/00* (2013.01)

(58) Field of Classification Search
CPC . G09F 13/044; G09F 2013/222; B60K 35/00; H03K 2217/96046; B60Q 3/82; B60N 2/0228
See application file for complete search history.

(56) References Cited

U.S. PATENT DOCUMENTS

| 2012/0024685 A1 | 2/2012 | Kobayashi et al. |
| 2014/0043828 A1* | 2/2014 | Yokota ...................... F21K 9/61 |
| | | 362/311.06 |

(Continued)

FOREIGN PATENT DOCUMENTS

| JP | 5212229 B2 | 6/2013 | |
| WO | 2009/089092 A1 | 7/2009 | |
| WO | WO-2009089092 A1 * | 7/2009 | ........... B60N 2/0228 |

*Primary Examiner* — Mirza F Alam
(74) *Attorney, Agent, or Firm* — Studebaker & Brackett PC

(57) ABSTRACT

A sensor that includes a switch unit and that detects a pressure applied from the front side to the switch unit or a finger approaching the switch unit from the front side is located on the back side of upholstery. A base member has a protruding portion on its surface. The upholstery includes: a light-transmitting region that is located over a light guide portion of the base member and the switch unit of the sensor and that allows light from a light source to transmit therethrough to the front side; and a non-light-transmitting region that blocks the light from the light source. A raised portion that is raised on the front side of the upholstery is located near the light-transmitting region in the non-light-transmitting region of the upholstery. The protruding portion of the base member is placed in the raised portion from the back side of the upholstery.

4 Claims, 3 Drawing Sheets

(51) Int. Cl.
    *G09F 13/00*     (2006.01)
    *H01H 36/00*     (2006.01)

(56) References Cited

U.S. PATENT DOCUMENTS

| | | | |
|---|---|---|---|
| 2019/0384090 A1* | 12/2019 | Kishimoto | G02F 1/1345 |
| 2020/0207287 A1* | 7/2020 | Takase | B32B 27/08 |
| 2022/0172909 A1* | 6/2022 | Doro | F21V 13/04 |

* cited by examiner (1)
DISPLAY PANEL

CROSS-REFERENCE TO RELATED APPLICATIONS

This is a continuation of International Application No. PCT/JP2020/019522 filed on May 15, 2020, which claims priority to Japanese Patent Application No. 2019-119896 filed on Jun. 27, 2019. The entire disclosures of these applications are incorporated by reference herein.

BACKGROUND

The present disclosure relates to display panels including a base member and upholstery located on the front side of the base member.

Japanese Patent No. 5212229 discloses a display panel including: a base member having a light guide portion that guides light from a light source toward the front side; and upholstery located on the front side of the base member. In this display panel, a sensor that includes a switch unit and that detects a pressure applied from the front side to the switch unit is located on the back side of the upholstery. The entire upholstery is made of a light-transmitting material, and a mask plate having a light-transmitting region that allows light from the light source to transmit therethrough and a light-shielding region that blocks light from the light source is located on the back side of the upholstery. A predetermined pattern appears on the surface of the upholstery by the light from the light source transmitted through the light-transmitting region of the mask plate from the back side.

SUMMARY

In such a display panel as shown in Japanese Patent No. 5212229, the mask plate may not be provided, and the upholstery may have a light-transmitting region that allows light from the light source to transmit therethrough to the front side and a non-light-transmitting region that blocks light from the light source. In this case, however, the light-transmitting region tends to be displaced as the upholstery is stretchy.

The present disclosure was made under the above circumstances, and it is an object of the present disclosure to reduce displacement of a light-transmitting region of upholstery.

In order to achieve the above object, the present disclosure is characterized in that a part of upholstery located near a light-transmitting region is engaged with a part of a base member.

Specifically, a first aspect of the present disclosure is directed to a display panel including: a base member including a light guide portion that guides light from a light source toward a front side; and upholstery located on a front side of the base member. The first aspect of the present disclosure has the following means for solving the problem.

That is, the first aspect is characterized in that a sensor that includes a switch unit and that detects a pressure applied from the front side to the switch unit or a finger approaching the switch unit from the front side is located on a back side of the upholstery, the base member has a protruding portion on its surface, and the upholstery includes: a light-transmitting region that is located over the light guide portion of the base member and the switch unit of the sensor and that allows the light from the light source to transmit therethrough to the front side; and a non-light-transmitting region that blocks the light from the light source, a raised portion that is raised on a front side of the upholstery is located near the light-transmitting region in the non-light-transmitting region of the upholstery, and the protruding portion of the base member is placed in the raised portion from the back side of the upholstery.

A second aspect is characterized in that, in the display panel according to the first aspect, the raised portion of the upholstery sandwiches the light-transmitting region from at least two directions.

A third aspect is characterized in that, in the display panel according to the first or second aspect, a cushioning layer made of a light-transmitting material with cushioning properties is located on the front side of the base member, the cushioning layer has a through portion, the protruding portion of the base member extends through the through portion of the cushioning layer, and a tip end of the protruding portion of the base member is in contact with a back side of the raised portion of the upholstery.

According to the first aspect, the raised portion of the upholstery located near the light-transmitting region of the upholstery is positioned with respect to the base member by inserting the protruding portion of the base member into the raised portion of the upholstery. This configuration reduces displacement of the light-transmitting region of the upholstery with respect to the base member.

A user who remembers the positional relationship between the raised portion and the light-transmitting region of the upholstery would identify the position of the light-transmitting region by merely touching the raised portion of the upholstery. It is therefore easy for the user to operate the display panel without looking at it.

According to the second aspect, the raised portion of the upholstery located at least on both sides of the light-transmitting region is positioned with respect to the base member. This configuration reduces variation in amount by which the light-transmitting region of the upholstery is stretched, and therefore reduces distortion of the shape of the light-transmitting region.

According to the third aspect, since there is no cushioning layer between the raised portion of the upholstery and the tip end of the protruding portion of the base member, the raised portion of the upholstery will not move even when the cushioning layer is deformed. Accordingly, the light-transmitting region of the upholstery can be more accurately positioned.

DETAILED DESCRIPTION

An embodiment of the present disclosure will be described with reference to the drawings.

Figure 1:
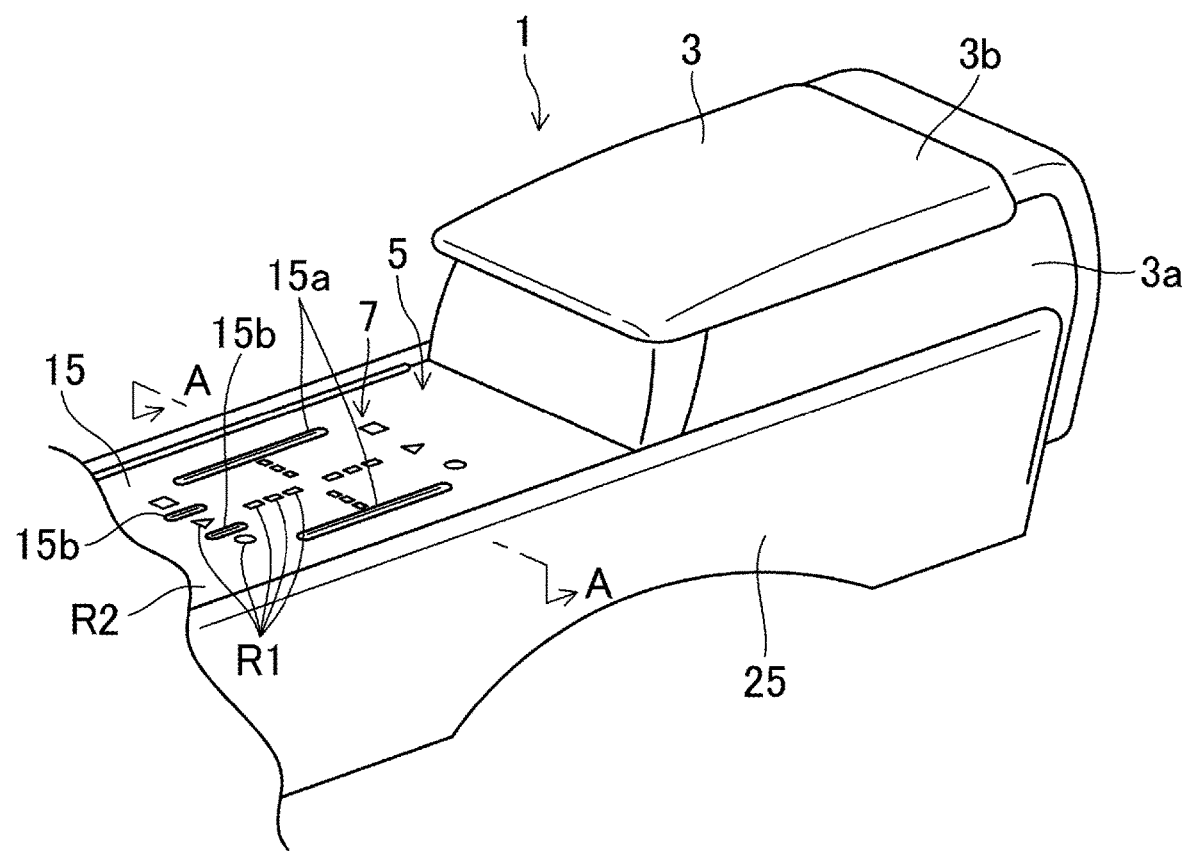
FIG. 1 is a perspective view of a rear end portion of a console including a display panel according to an embodiment of the present disclosure.

FIG. 1 shows a console 1 placed between a driver's seat and a passenger seat of an automobile so as to extend in the longitudinal direction of a vehicle body. The console 1 includes a console box 3, and the console box 3 includes a box body 3a that is open upward and a lid 3b attached to the box body 3a such that the lid 3b can be opened and closed. The lid 3b can be used as an armrest when closed. A switch device 5 is located below the lid 3b in front of the console box 3 in the longitudinal direction of the vehicle body. The switch device 5 includes a display panel 7 according to the embodiment with its front surface facing upward.

Figure 2:
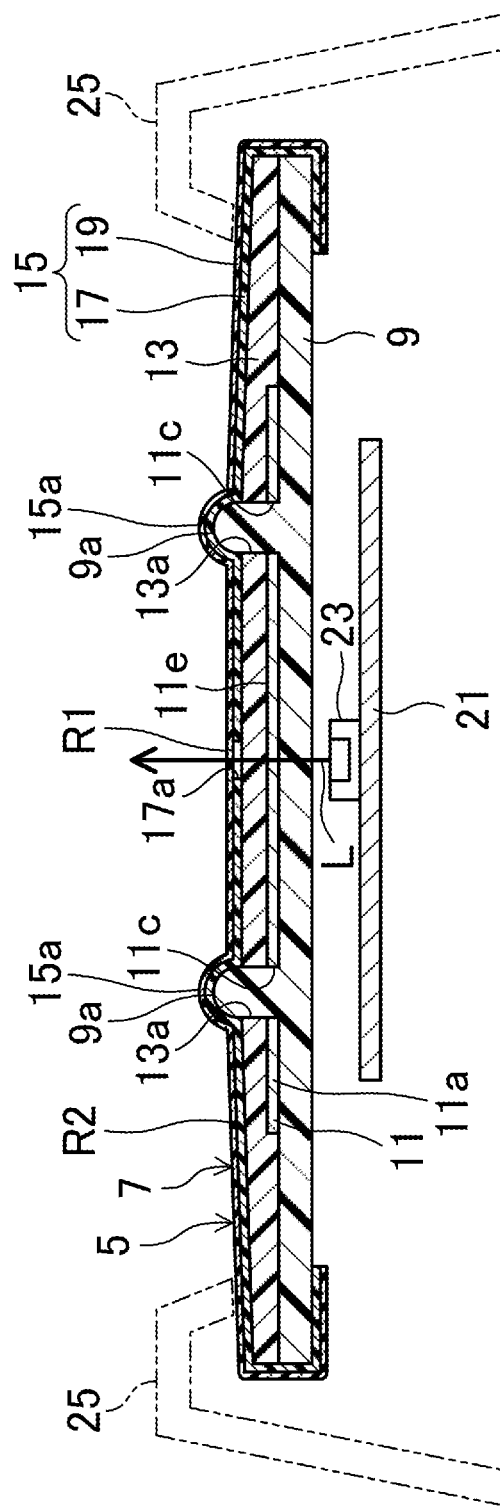
FIG. 2 is a sectional view taken along line A-A in FIG. 1.
Figure 3:
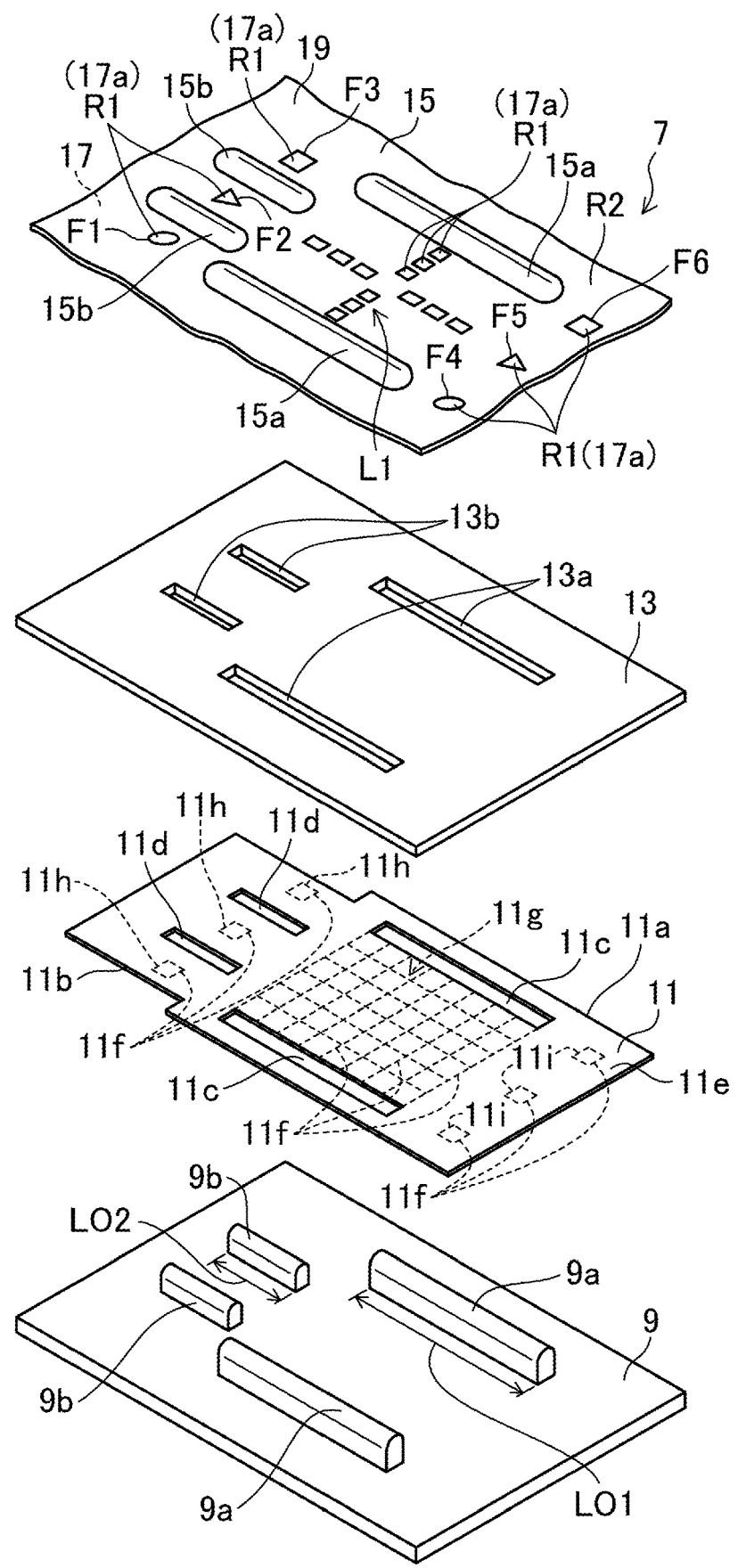
FIG. 3 is an exploded perspective view of the display panel according to the embodiment of the present disclosure.

As shown in FIGS. 2 and 3, the display panel 7 includes a substantially rectangular plate-like base member 9 that is long in the longitudinal direction of the vehicle body. The base member 9 is made of a hard light-transmitting resin such as polypropylene (PP) or acrylic resin. The entire base member 9 forms a light guide portion that guides light L from a light-emitting diode (LED) 23 (described later) serving as a light source toward the front side. First ridges 9a, which are a pair of protruding portions extending parallel to the longitudinal direction of the vehicle body, are formed on an intermediate part of the front surface of the base member 9 in the longitudinal direction of the vehicle body so as to face each other at an interval in the lateral direction of the vehicle body. The tip ends of the first ridges 9a have a semicircular cross section that becomes narrower toward the top. Second ridges 9b, which are a pair of protruding portions located inward of the first ridges 9a in the lateral direction of the vehicle body and extending parallel to the longitudinal direction of the vehicle body, are formed in front of the first ridges 9a on the front surface of the base member 9 so as to face each other at an interval in the lateral direction of the vehicle body. The tip ends of the second ridges 9b also have a semicircular cross section that becomes narrower toward the top. The length LO2 of the second ridges 9b in the longitudinal direction of the vehicle body is about ⅓ of the length LO1 of the first ridges 9a in the longitudinal direction of the vehicle body.

A sheet-like light-transmitting electrostatic sensor 11 is located on the front surface of the base member 9. The electrostatic sensor 11 includes: a wide portion 11a having a width larger than the interval between the outer edges of the first ridges 9a in the lateral direction of the vehicle body and smaller than the width of the base member 9 and extending in the longitudinal direction of the vehicle body; and a narrow portion 11b having a width smaller than the width of the wide portion 11a and extending from the front edge of the wide portion 11a toward the front of the vehicle body. Elongated first through holes 11c extending parallel to each other in the longitudinal direction of the vehicle body are formed near both ends of the wide portion 11a in the lateral direction of the vehicle body. Elongated second through holes 11d extending parallel to each other in the longitudinal direction of the vehicle body are formed in the narrow portion 11b at positions dividing the narrow portion 11b into three substantially equal parts in the lateral direction of the vehicle body. The first ridges 9a of the base member 9 extend through the first through holes 11c, and the second ridges 9b of the base member 9 extend through the second through holes 11d. The electrostatic sensor 11 includes a transparent film base member 11e and transparent electrodes 11f that are a plurality of switch units formed in the film base member 11e. The electrostatic sensor 11 detects a finger approaching each transparent electrode 11f from the front side, and outputs the detection result to in-vehicle equipment such as an audio device (not shown) or a navigation device (not shown). The plurality of transparent electrodes 11f forms central switches 11g arranged between the first through holes 11c, three front switches 11h located on the left side of the left second through hole 11d, between the second through holes 11d, and on the right side of the right second through hole 11d, and three rear switches 11i located near the rear end of the wide portion 11a.

A cushioning layer 13 having the same shape as the base member 9 as viewed in plan is located over the entire surface of a region of the base member 9 where the electrostatic sensor 11 is not located and the entire surface of the electrostatic sensor 11. The cushioning layer 13 is made of a light-transmitting material with cushioning properties such as urethane foam or silicone resin. Third through holes 13a, which are through portions in the shape of an elongated hole, are formed in the cushioning layer 13 at positions corresponding to the first ridges 9a of the base member 9. Fourth through holes 13b, which are through portions in the shape of an elongated hole, are also formed in the cushioning layer 13 at positions corresponding to the second ridges 9b of the base member 9. The first ridges 9a of the base member 9 extend through the third through holes 13a, and the second ridges 9b of the base member 9 extend through the fourth through holes 13b.

Stretchy upholstery 15 is located over the entire surface of the cushioning layer 13. The upholstery 15 is made of a stretchy material such as polyvinyl chloride. The upholstery 15 is fixed to the cushioning layer 13 and the base member 9 by attaching the entire back surface of the upholstery 15 or a part of the back surface of the upholstery 15 to the surface of the cushioning layer 13 by either bonding with an adhesive or welding with the ends of the upholstery 15 placed on the back side of the base member 9. The upholstery 15 has a non-light transmitting light-shielding layer 17 having a plurality of openings 17a and colored with a black pigment, and a light-transmitting smoke layer 19 placed over the entire light-shielding layer 17 and the entire openings 17a from the front side. Areas of the smoke layer 19 that cover the openings 17a in the light-shielding layer 17 form light-transmitting regions R1 of the upholstery 15. The entire light-shielding layer 17 and an area of the smoke layer 19 that covers the light-shielding layer 17 form a non-light-transmitting region R2. The openings 17a in the light-shielding layer 17 of the upholstery 15 are formed in such a manner that the openings 17a form a dotted line group L1 extending substantially from the center of the upholstery 15 outward in both the longitudinal and lateral directions of the vehicle body, first, second, and third shapes F1, F2, and F3 located in this order from left to right in front of the dotted line group L1 in the longitudinal direction of the vehicle body, and fourth, fifth, and sixth shapes F4, F5, and F6 located in this order from left to right behind the dotted line group L1 in the longitudinal direction of the vehicle body. Accordingly, the light-transmitting regions R1 also form the dotted line group L1 and the first to sixth shapes F1 to F6. Those light-transmitting regions R1 forming the dotted line group L1 are located over those transparent electrodes 11f forming the central switches 11g of the electrostatic sensor 11. Those light-transmitting regions R1 forming the first to third shapes F1 to F3 are located over those transparent electrodes 11f forming the front switches 11h of the electrostatic sensor 11. Those light-transmitting regions R1 forming the fourth to sixth shapes F4 to F6 are located over those transparent electrodes 11f forming the rear switches 11i of the electrostatic sensor 11. First raised portions 15a that are raised on the front side of the upholstery 15 are formed on both sides of those light-transmitting regions R1 forming the dotted line group L1 in the lateral direction of the vehicle body at positions near these light-transmitting regions R1. The first raised portions 15a have a semicircular arc cross section and extend in the longitudinal direction of the vehicle body. That is, the first raised portions 15a face each other with those light-transmitting regions R1 forming the dotted line group L1 sandwiched therebetween from both sides in the lateral direction of the vehicle body (from two directions). Second raised portions 15b that are raised on the front side of the upholstery 15 are formed on both sides of the light-transmitting region R1 forming the second shape F2 in the lateral direction of the vehicle body at positions near this light-transmitting region R1. The second raised portions 15b have a semicircular arc cross section and extend in the longitudinal direction of the vehicle body. That is, the second raised portions 15b face each other with the light-transmitting region R1 forming the second shape F2 sandwiched therebetween from both sides in the lateral direction of the vehicle body (from two directions). Both of the second raised portions 15b are located inward of those light-transmitting regions R1 forming the first and third shapes F1, F3 in the lateral direction of the vehicle body at positions near these light-transmitting regions R1. The tip ends of the first ridges 9a of the base member 9 are placed in the first raised portions 15a so as to be in contact with the back sides of the first raised portions 15a. The tip ends of the second ridges 9b of the base member 9 are placed in the second raised portions 15b so as to be in contact with the back sides of the second raised portions 15b.

A substrate 21 is located on the back side of the base member 9 with a component side of the substrate 21 facing substantially the central part of the base member 9. The LED 23 is mounted on the component side of the substrate 21.

Side covers 25 are placed on both sides of the switch device 5 in the lateral direction of the vehicle body so as to cover both ends of the surface of the display panel 7 in the lateral direction of the vehicle body from above and sides.

In order to assemble the display panel 7 configured as described above, the electrostatic sensor 11 is first placed on the front surface of the base member 9. At this time, the electrostatic sensor 11 can be positioned with respect to the base member 9 by inserting the first ridges 9a of the base member 9 through the first through holes 11c in the electrostatic sensor 11 and inserting the second ridges 9b of the base member 9 through the second through holes 11d in the electrostatic sensor 11. This configuration facilitates the positioning of the electrostatic sensor 11. Next, the cushioning layer 13 is placed on the surface of the region of the base member 9 where the electrostatic sensor 11 is not located and the surface of the electrostatic sensor 11. At this time, the cushioning layer 13 can be positioned with respect to the base member 9 and the electrostatic sensor 11 by inserting the first ridges 9a of the base member 9 through the third through holes 13a in the cushioning layer 13 and inserting the second ridges 9b of the base member 9 through the fourth through holes 13b in the cushioning layer 13. This configuration facilitates the positioning of the cushioning layer 13. Thereafter, the upholstery 15 is fixed to the cushioning layer 13 and the base member 9 by stretching the upholstery 15 and attaching the back surface of the upholstery 15 to the surface of the cushioning layer 13 by either bonding with an adhesive or welding with the ends of the upholstery 15 placed on the back side of the base member 9. At this time, the upholstery 15 can be positioned with respect to the base member 9 by inserting the first ridges 9a of the base member 9 into the first raised portions 15a of the upholstery 15 and inserting the second ridges 9b of the base member 9 into the second raised portions 15b of the upholstery 15. This configuration facilitates the positioning of the upholstery 15. The first raised portions 15a of the upholstery 15 that are located on both sides of those light-transmitting regions R1 forming the dotted line group L1 in the lateral direction of the vehicle body are positioned with respect to the base member 9. This configuration reduces variation in amount by which those light-transmitting regions R1 forming the dotted line group L1 are stretched in the lateral direction of the vehicle body. Moreover, the second raised portions 15b of the upholstery 15 that are located on both sides of the light-transmitting region R1 forming the second shape F2 in the lateral direction of the vehicle body are positioned with respect to the base member 9. This configuration reduces variation in amount by which the light-transmitting region R1 forming the second shape F2 is stretched in the lateral direction of the vehicle body. Accordingly, distortion of the shapes of those light-transmitting regions R1 forming the dotted line group L1 and the second shape F2 can be reduced.

When the LED 23 of the switch device 5 configured as described above emits light L, the light L is incident on the back side of the upholstery 15 through the base member 9, the electrostatic sensor 11, and the cushioning layer 13. A part of the incident light L passes through the light-transmitting regions R1, but the remaining incident light L is blocked by the non-light-transmitting region R2. As a result, the shapes of the light-transmitting regions R1, that is, the dotted line group L1 and the first to sixth shapes F1 to F6 clearly appear on the surface of the upholstery 15. When the user brings his or her finger toward the area of the surface of the upholstery 15 where the dotted line group L1 appears and rotates the finger, the electrostatic sensor 11 detects the finger approaching the transparent electrodes 11f forming the central switches 11g and outputs the detection result to the audio device or the navigation device in the vehicle. The audio device or the navigation device in the vehicle then operates according to the detection result received from the electrostatic sensor 11. At this time, the user who remembers the positional relationship between the first raised portions 15a of the upholstery 15 and those light-transmitting regions R1 forming the dotted line group L1 would identify the positions of those light-transmitting regions R1 forming the dotted line group L1 by merely touching the first raised portions 15a of the upholstery 15. It is therefore easy for the user to operate the display panel 7 without looking at it. Similarly, when the user brings his or her finger toward one of the areas of the surface of the upholstery 15 where the first to sixth shapes F1 to F6 appear, the electrostatic sensor 11 detects the finger approaching a corresponding one of the transparent electrodes 11f (front switches 11h and rear switches 11i), and outputs the detection result to the audio device or the navigation device in the vehicle. The audio device or the navigation device in the vehicle then operates according to the detection result received from the electrostatic sensor 11.

According to the present embodiment, the first raised portions 15a that are located near those light-transmitting regions R1 forming the dotted line group L1 of the upholstery 15 are positioned with respect to the base member 9 by inserting the first ridges 9a of the base member 9 into the first raised portions 15a. This configuration reduces displacement of those light-transmitting regions R1 forming the dotted line group L1 with respect to the base member 9.

Moreover, the second raised portions 15b that are located near those light-transmitting regions R1 forming the first to third shapes F1 to F3 of the upholstery 15 are positioned with respect to the base member 9 by inserting the second ridges 9b of the base member 9 into the second raised portions 15b. This configuration reduces displacement of those light-transmitting regions R1 forming the first to third shapes F1 to F3 with respect to the base member 9.

Since there is no cushioning layer 13 between the first and second raised portions 15a, 15b of the upholstery 15 and the tip ends of the first and second ridges 9a, 9b of the base member 9, the first and second raised portions 15a, 15b of the upholstery 15 will not move even when the cushioning layer 13 is deformed. Accordingly, the light-transmitting regions R1 of the upholstery 15 can be more accurately positioned.

In the present embodiment, the entire base member 9 is made of a light-transmitting resin. However, a part of the base member 9 may be made of an opaque resin so that only the remaining part of the base member 9 serves as the light guide portion. In this case, the upholstery 15 may be placed such that the light-transmitting regions R1 of the upholstery 15 are located over the light guide portion.

In the present embodiment, the electrostatic sensor 11 is located between the cushioning layer 13 and the base member 9. However, the electrostatic sensor 11 may be located at any other position such as on the back side of the base member 9 as long as the electrostatic sensor 11 is located on the back side of the upholstery 15.

In the present embodiment, the sensor mounted on the front surface of the base member 9 is the electrostatic sensor 11. However, a pressure sensor that has a switch unit and that detects a pressure applied from the front side to the switch unit may be mounted on the front surface of the base member 9.

In the present embodiment, the two first raised portions 15a and the two second raised portions 15b are formed so as to sandwich the light-transmitting region(s) R1 therebetween from two directions. However, three or more first raised portions 15a and three or more second raised portions 15b may be formed so as to surround the light-transmitting region(s) R1 from three directions. Alternatively, the first raised portion 15a and the second raised portion 15b may be formed in an annular pattern so as to surround the light-transmitting region(s) R1 from all directions.

In the present embodiment, the non-light-transmitting region R2 of the upholstery 15 is composed of the smoke layer 19 and the light-shielding layer 17. However, the non-light-transmitting region R2 of the upholstery 15 may be composed of a light-transmitting upholstery material and a coating film formed on the upholstery material by coating.

In the present embodiment, the first ridges 9a and the second ridges 9b of the base member 9 extend through the third through holes 13a and the fourth through holes 13b in the cushioning layer 13. However, the cushioning layer 13 may have slits or cutouts, and the first ridges 9a and the second ridges 9b of the base member 9 may extend through the slits or the cutouts.

In the present embodiment, the first ridges 9a and the second ridges 9b of the base member 9 have a semicircular cross section that becomes narrower toward the top, and the first raised portions 15a and the second raised portions 15b of the upholstery 15 have a semicircular arc cross section. However, the first ridges 9a and the second ridges 9b of the base member 9 may have a polygonal cross section, and the first raised portions 15a and the second raised portions 15b of the upholstery 15 may have a cross-sectional shape that conforms to the cross-sectional shape of the first ridges 9a and the second ridges 9b.

The present disclosure is useful as a display panel including a base member and upholstery located on the front side of the base member.

What is claimed is:

1. A display panel, comprising:
a base member including a light guide portion that guides light from a light source toward a front side; and
upholstery located on a front side of the base member, wherein
a sensor that includes a switch unit and that detects a pressure applied from the front side to the switch unit or a finger approaching the switch unit from the front side is located on a back side of the upholstery,
the base member has a protruding portion on its surface, and
the upholstery includes: a light-transmitting region that is located over the light guide portion of the base member and the switch unit of the sensor and that allows the light from the light source to transmit therethrough to the front side; and a non-light-transmitting region that blocks the light from the light source, a raised portion that is raised on a front side of the upholstery is located near the light-transmitting region in the non-light-transmitting region of the upholstery, and the protruding portion of the base member is placed in the raised portion from the back side of the upholstery.

2. The display panel of claim 1, wherein
the raised portion of the upholstery sandwiches the light-transmitting region from at least two directions.

3. The display panel of claim 1, wherein
a cushioning layer made of a light-transmitting material with cushioning properties is located on the front side of the base member, and the cushioning layer has a through portion,
the protruding portion of the base member extends through the through portion of the cushioning layer, and
a tip end of the protruding portion of the base member is in contact with a back side of the raised portion of the upholstery.

4. The display panel of claim 2, wherein
a cushioning layer made of a light-transmitting material with cushioning properties is located on the front side of the base member, and the cushioning layer has a through portion,
the protruding portion of the base member extends through the through portion of the cushioning layer, and
a tip end of the protruding portion of the base member is in contact with a back side of the raised portion of the upholstery.

* * * * *